United States Patent
Fryklund et al.

[11] Patent Number: 5,917,233
[45] Date of Patent: *Jun. 29, 1999

[54] INTEGRATED CIRCUIT HAVING A PARASITIC RESONANCE FILTER

[75] Inventors: David John Fryklund, Hampton Falls; Paul John Schwab, Hudson, both of N.H.; Graham John Headlem Wells, Dracut, Mass.

[73] Assignee: The Whitaker Corporation, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 08/801,286

[22] Filed: Feb. 18, 1997

[51] Int. Cl.⁶ .................................................. H01L 23/495
[52] U.S. Cl. .......................... 257/666; 257/724; 257/728; 257/665
[58] Field of Search ..................... 257/666, 924, 257/723, 724, 728, 665

[56] References Cited

U.S. PATENT DOCUMENTS

| | | | |
|---|---|---|---|
| 5,220,298 | 6/1993 | Nagase | 333/185 |
| 5,495,125 | 2/1996 | Uemura | 257/666 |
| 5,635,751 | 6/1997 | Ikeda et al. | 257/666 |

FOREIGN PATENT DOCUMENTS

| | | | |
|---|---|---|---|
| 0595600A1 | 10/1993 | European Pat. Off. | H01L 23/66 |
| 3337796 | 4/1985 | Germany | 257/924 |
| 3337796 A1 | 4/1985 | Germany . | |

OTHER PUBLICATIONS

Patent Abstracts of Japan, Application Date Aug. 26, 1991, Application Number 03213409.

PCT Search Report, dated Jul. 15, 1998, PCT/US 98/03290.

Publication Title: Wireless Systems Design; Authors: Theodore J. Kalinka and Thomas W. Baker; Article Title: Minimizing GSM Mobile–Terminal Design Risk Allows Easier Upgrades; Date of Article: May, 1996; Pertinent pp.: 54 And 55;.

Primary Examiner—Peter Toby Brown
Assistant Examiner—Roy Potter
Attorney, Agent, or Firm—June B. Schuette

[57] ABSTRACT

A packaged integrated circuit configured for interconnection to an external component comprises a die (1) having a high frequency contact (8), the die (1) being disposed on a lead frame (3). The lead frame (3) comprises a plurality of leads (9). At least two of the leads are first and second RF port leads (9a, 9b) which are electrically connected to the RF port. When mounted to a printed circuit board substrate, there is a capacitor (12) connected between the first and second high frequency contact (8) leads (9a, 9b) to achieve frequency specific signal attenuation at an unwanted frequency with minimal contribution of insertion loss at a desired frequency.

14 Claims, 3 Drawing Sheets

INTEGRATED CIRCUIT HAVING A PARASITIC RESONANCE FILTER

FIELD OF THE INVENTION

The present invention relates to integrated circuits and more particularly to a high frequency integrated circuit having filtered ports.

BACKGROUND OF THE INVENTION

High frequency systems, including radio frequency (RF) and microwave systems, generally comprise multiple high frequency integrated circuits (IC) and discrete devices interconnected on a printed circuit board. Typically, a high frequency system requires generation and amplification of a distortion free fundamental operating frequency. As a practical matter, high frequency components and systems often generate unwanted harmonics of the fundamental operating frequency through amplification and switching functions conventionally performed within the system. It is desirable to filter out these harmonics generated by the system so that the signal with which the system operates is as free of harmonic distortion as possible. A low harmonic distortion system generally exhibits better efficiency overall. In order to reduce harmonic distortion, it is conventional to filter out harmonics of the fundamental frequency at an RF output port on one or more of the ICs within the system. It is a matter of designer judgment at which IC or ICs to place the filter.

An article entitled "Minimizing GSM Mobile-Terminal Design Risk Allows Easier Upgrades" by Kalinka & Baker from the May 1996 publication of Wireless Systems Design magazine, shows conventional filtering of harmonic distortion at both the input of a power amplifier (PA) and the output of a low noise amplifier (LNA)/RF mixer in a GSM terminal. The filters shown by way of block diagram representation typically comprise from three to seven discrete elements or ceramic resonators soldered to the printed circuit board and connected to an RF port lead of the IC. Disadvantageously, these filters can be complex and generally consume a relatively large amount of usable surface area on the printed wiring board. Additionally these filters can contribute up to 1 dB of insertion loss to the system. In the case of a power amplifier IC used with conventional filtering, in order to achieve the desired system output power, the power amplifier must output sufficient power to supply the output power required by the system at the output stage of the filter in addition to the power lost due to the insertion loss of the filter. This additional output power requires more DC current be drawn by the power amplifier. The added DC current drain disadvantageously decreases efficiency and increases heat generation. Accordingly, the traditional filtering contributes to a larger, more complex, and less efficient system design which is in contravention of the interest to miniaturize and to extend battery life.

There is a need, therefore, for improved filtering in a high frequency system that does not adversely effect insertion loss, efficiency or miniaturization.

SUMMARY OF THE INVENTION

It is an object of the present invention to improve filtering in a high frequency system.

It is an object of the present invention to provide filtering for an IC without increasing insertion loss.

It is another object of the present invention to reduce external filter complexity.

It is another object of the present invention to reduce the printed circuit board surface area traditionally required for external filtering of high frequency ICs.

It is another object of the present invention to decrease the harmonic distortion present in a high frequency system.

A packaged IC configured to be connected to an external filter comprises a die having an RF port. The die is disposed on a lead frame which comprises a plurality of leads. At least two of the leads are first and second RF port leads. The first and second RF port leads are electrically connected to the RF port.

It is an advantage of an IC according to the teachings of the present invention that an undesired signal may be filtered without adversely effecting insertion loss, efficiency, or miniaturization.

BRIEF DESCRIPTION OF THE DRAWINGS

Embodiments of the invention will now be described by way of example and in conjunction with the following figures in which.

DETAILED DESCRIPTION OF THE PREFERRED EMBODIMENTS

Figure 1:
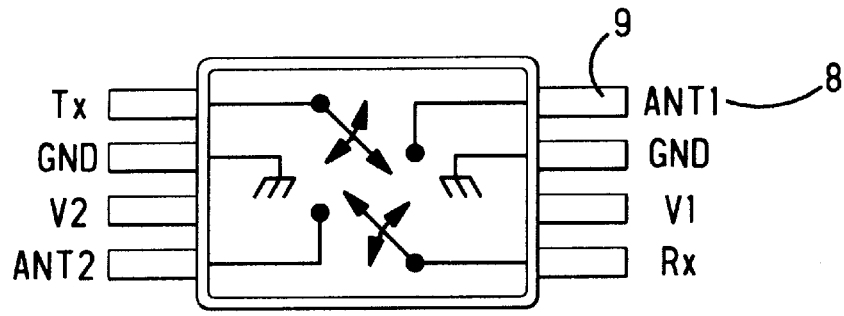
FIG. 1 is a functional schematic of a known transmit/receive diversity switch.
Figure 2:
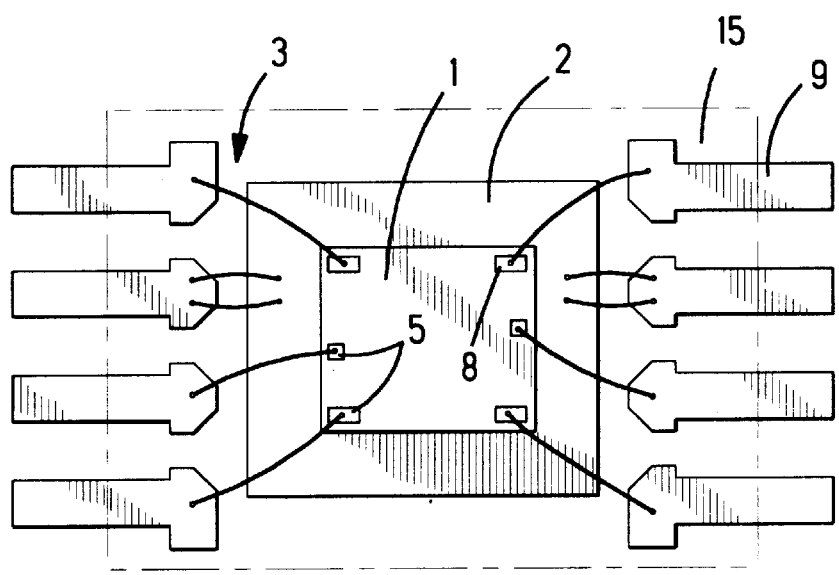
FIG. 2 is a known pinout of a packaged diversity switch.

For purposes of describing a preferred embodiment of the present invention, there is shown in the drawings an implementation of a GaAs based transmit/receive diversity switch according to the prior art and according to the teachings of the present invention. A functional schematic of a prior art transmit/receive diversity switch is shown in FIG. 1 of the drawings. As one of ordinary skill in the art can appreciate, the switch is made up of a symmetrical die. FIG. 2 of the drawings illustrates the prior art pin out of the diversity switch which shows the die (1) epoxied to a die attach paddle (2) of a SSOP-8 lead frame (3). The standard SSOP-8 lead frame (3) has a total of eight leads. A plastic body (15) molded around the lead frame (3), is shown in phantom line representation. A ceramic or glass package body (not shown) is also appropriate as are other types and sizes of lead frames including the MSOP,SOIC, TSSOP and SOT packages. The die (1) has contacts (5) thereon providing appropriate electrical access to and from the die (1). Each contact (5) is wire bonded according to conventional procedure to appropriate leads of the lead frame (3).

Figure 3:
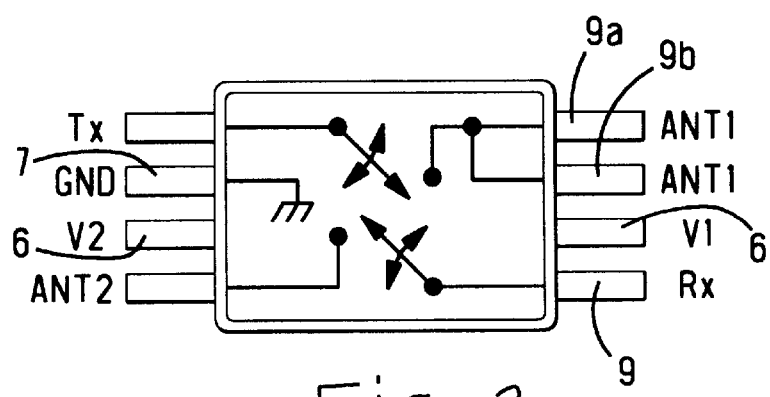
FIG. 3 is a functional schematic of a transmit receive diversity switch according to the teachings of the present invention.
Figure 4:
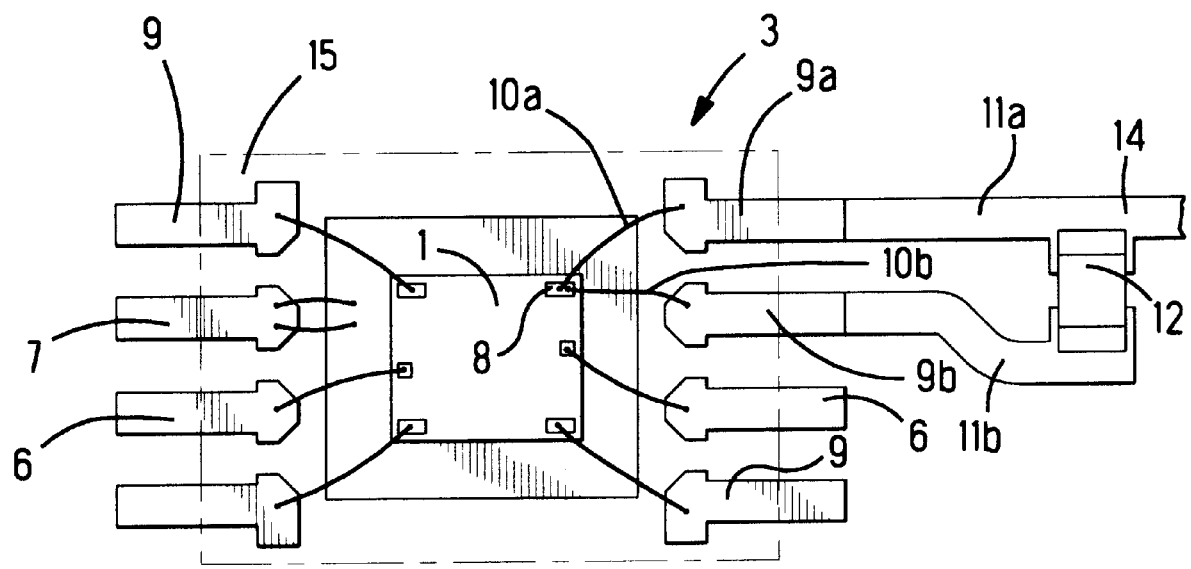
FIG. 4 is a pinout of a packaged diversity switch according to the teachings of the present invention.

The diversity switch packaged in an eight lead SSOP is shown configured for filtering a first RF port (8). In the prior art pin out as shown in FIG. 2, a high frequency contact provides access to an RF port and is interconnected to a single RF port lead (9). In an embodiment of the diversity switch according to the teachings of the present invention and with specific reference to FIGS. 3 and 4 of the drawings, adjacent high frequency contacts (8) are electrically identical and provide access to the RF port. Each high frequency contact is wirebonded to two adjacent leads (9a, 9b). The pin out further comprises two DC bias leads (6), one ground lead (7), and three RF ports each connected to one lead (9) each. The specific wire bond configuration depends upon the number of leads available in the package, the number of DC biases and grounds necessary for the IC (1), and the desired filtering for the RF ports. In the embodiment shown in FIG. 4 of the drawings, the wire bond configuration deviates from the conventional configuration of each contact (5) wire bonded to a single lead, in that the RF output port to be filtered has two wire bonds (10a, 10b) electrically interconnecting a single high frequency signal contact (8) to two signal leads (9a, 9b). A first wire bond (10a) is connected to a first RF port lead (9a) and a second wire bond (10b) is connected to a second RF port lead (9b). In a less preferred embodiment, the IC presents the same RF port (8) signal at two different high frequency contacts (5) on the die (1).

In that case, each RF port lead (9a, 9b) is electrically connected to a different high frequency each different contact (5) signal contacts carrying substantially the same signal. When the packaged IC is assembled and soldered to a printed wiring board substrate, each RF output port lead (9a, 9b) is electrically connected to a length of conductive trace, which at RF and microwave frequencies, behaves as a transmission line. First RF output port lead (9a) is connected to first trace (11a) and second RF output port lead (9b) is connected to second trace (11b) in connecting elements comprising known manner.

It is an object of the present invention to take advantage of the parasitic inductance already present in the wirebond (10a, 10b), lead (9a, 9b) and transmission line (11a, 11b) and use it to create a filtering circuit for use in conjunction with the IC (1).

Figure 5:
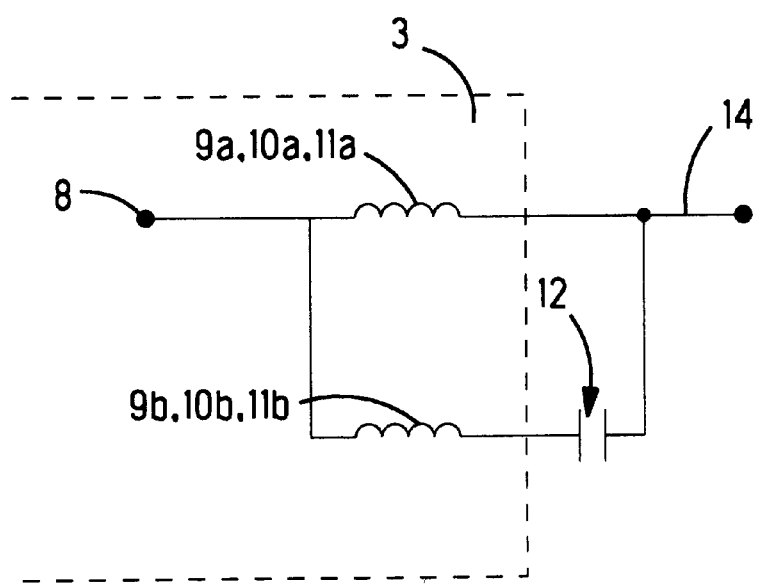
FIG. 5 is a schematic diagram of an equivalent circuit of a filter according to the teachings of the present invention.

Pursuant to the objective, a capacitor (12) is connected between the first and second traces (11a, 11b). The parasitic inductance associated with each wire bond (10a, 10b), RF port lead (9a, 9b) and trace (11a, 11b) when interconnected with capacitor (12) creates a filter circuit. A lumped element equivalent circuit of the parasitic resonance filter circuit is shown in FIG. 5 of the drawings. This filter circuit is tuned by appropriate estimate or measurement of the inductance of the wire bond (10a), lead (9a), and trace (11a) and by appropriate selection of the value of the capacitor (12) to resonate at a desired frequency. Typically, the highest power unwanted spectral component of an RF/microwave system is the second harmonic of the fundamental operating frequency. Accordingly, for a 900 Mhz system, the capacitor (12) is selected to create a 1800 Mhz resonant circuit.

Each series combination of the wire bond (10a, 10b), the lead (9a, 9b), and the trace (11a, 11b) is equivalently represented as an inductor. As there are two similar combinations, each is represented by inductive values L1 and L2, respectively, having substantially equal value. The resonant frequency of the equivalent circuit occurs when the admittance (Y) of the filter circuit is zero. Accordingly, the admittance $Y_{L1}$ of the inductor (10a, 9a, 11a) represented by L1 when summed with the admittance ($Y_{L2}$,C) of the series inductor (10b, 9b, 11b) represented by L2 and parallel capacitor (12) represented by C must equal zero:

$$Y_{L1} + Y_{L2,C1} = 0$$

Representing the admittance in terms of frequency and inductance:

$$\frac{1}{j\omega L_1} + \frac{1}{j\omega L_2 + \frac{1}{j\omega C}} = 0$$

$$\frac{j\omega L_2 + \frac{1}{j\omega C}}{j\omega L_1} + 1 = 0$$

Because the value of $L_1$ equals $L_2$, the foregoing equation may be simplified by representing $L_1$ and $L_2$ with the single inductive value L where:

$$1 + \frac{\frac{1}{j\omega C}}{j\omega L} + 1 = 0$$

Solving for C:

$$\frac{1}{(j\omega C)(j\omega L)} = -2$$

$$\frac{1}{2\omega^2 CL} = 2$$

$$C = \frac{1}{2\omega^2 L} = \frac{1}{8\pi^2 f^2 L}.$$

Where f is the 2nd harmonic frequency.

The appropriate selection of the value of capacitor (12) for a given frequency, therefore, is a function of the parasitic inductance (L1, L2). Advantageously, only a single external component is required for implementation of the parasitic resonance filter and the space within which the external capacitor physically fits is significantly less than the space required for implementation of traditional filtering having more lumped elements. Space minimization is of particular importance in portable applications. Also of importance is that the parasitic resonance filter does not contribute insertion loss to the system at the operating frequency.

In an SSOP-8 IC package, the inductance of the wire bond (10a, 10b), the lead (9a, 9b), and the trace (11a, 11b) may be approximated to be 3 nH. This assumes use of gold wire bonds of 1 mil diameter, and 200 mil 50 ohm traces connecting to the external capacitor (12). This also assumes that the packaged IC is mounted to a printed circuit board substrate according to Application Note Number M538 entitled "Surface Mounting Instructions" published by M/A-COM, Inc. the contents of which are hereby incorporated by reference. For a 3 nH inductance, the appropriate value of the external capacitor (12) to create a parasitic filter that resonates at 1.8 Ghz is:

$$C = 1.3 \text{pF} = \frac{1}{8\pi^2 (1.8 \times 10^9)^2 (3 \times 10^{-9})}$$

Figure 6:
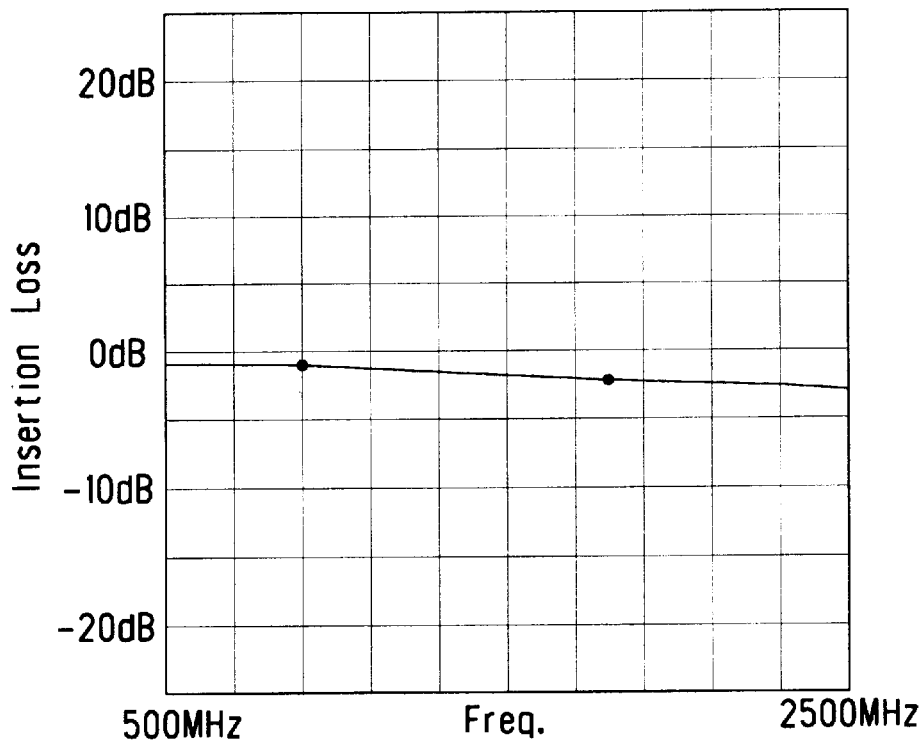
FIG. 6 is a graph of output power relative to input power versus frequency for an integrated circuit without filtering.
Figure 7:
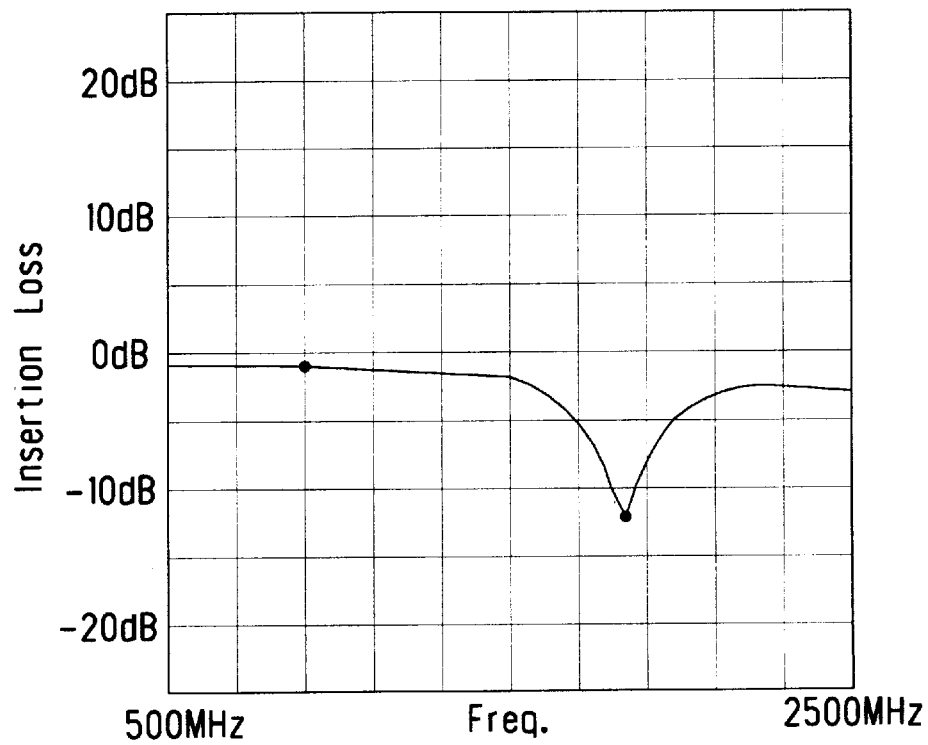
FIG. 7 is a graph of output power relative to input power at a filtered RF port of an integrated circuit having filtering according to the teachings of the present invention.

The performance of the known RF transmit/receive diversity switch without filtering is shown in FIG. 6 of the drawings. The insertion loss measurement was taken at the RF port lead. FIG. 7 of the drawings shows the performance of the same switch using a parasitic resonance filter according to the teachings of the present invention. The insertion loss measurement was taken at a filtered RF port (14). The particular filter implemented is designed to resonate at a second harmonic frequency of 1800 Mhz for a 900 Mhz system. As shown, there is minimal relative signal degradation at the desired fundamental operating frequency and a strong attenuation at the undesired second harmonic frequency. The sharp resonance seen at the second harmonic is the result of high Q factors of the parasitic inductors and the capacitor used to achieve the filtering. In this example, approximately 12 dB of rejection is achieved at the second harmonic frequency. Advantageously, signal degradation due to insertion loss is not increased by the addition of the capacitor (12). Because the package interconnects are inescapably present in any packaged IC mounted on a printed circuit board substrate and inasmuch as the parasitic inductances are inescapably present in the package, wirebonds and traces, filtering according to the teachings of the present invention contributes very little insertion loss at the fundamental operating frequency while performing the desirable function of second harmonic attenuation.

Filtering according to the teachings of the present invention is shown specifically for a diversity switch. The techniques of utilizing the wirebond, lead, and trace inductance, however, has significant advantages when utilized in conjunction with other high frequency ICs. As a specific example, a power amplifier integrated circuit having a filtered RF port according to the teachings of the present invention can be operated at a lower DC operating point. Consequently, there is less current drain than in the system which uses traditional filtering leading to lower operating temperatures and longer battery life.

Additionally, filtering according to the teachings of the present invention may also be implemented at RF input ports in order to filter undesired harmonics prior to operation on the signal by the IC. More than one filter according to the teachings of the present invention may be implemented on a single IC provided there are a sufficient number of leads available to dedicate two leads to each RF port to be filtered. As an example, in the embodiment shown for a receive/transmit diversity switch, both the Tx and the ANT1 RF ports may be filtered by dedicating the two GND leads (6) to the second RF port lead of the TX and ANT1 RF ports respectively. In this example, the switch may still be packaged in an SSOP-8 package because this particular switch operates in a floating condition. If the GND leads (6) were necessary, the same switch could be packaged in a larger package having additional available leads to support filtering of more than one RF port.

Other advantages of the invention are present from the detailed description by way of example and from accompanying drawings, and from the spirit and scope of the appended claims.

We claim:

1. An IC package comprising a die having an RF port, the die being disposed on a lead frame comprising a plurality of leads, one of said leads being a first RF port lead which is electrically connected to said RF port, said first RF port lead being connected to an external component, a second RF port lead, electrically connected to said RF port, and an external capacitor connected between said first and second RF port leads.

2. An IC package as recited in claim 1 wherein said first and second RF port leads are adjacent each other.

3. An IC package as recited in claim 1 wherein the package is ceramic.

4. An IC package as recited in claim 1 wherein the package is plastic.

5. An IC package as recited in claim 1 wherein the package is glass.

6. An IC package as recited in claim 1 wherein said RF port further comprises a plurality of high frequency contacts carrying substantially the same signal and said first RF port lead is connected to one of said plurality of high frequency contacts and said second RF port lead is connected to another one of said plurality of high frequency signal contacts.

7. An IC as a component part of a circuit comprising:

a die having a high frequency contact, and being connected to the circuit through first and second connecting elements a filter electrically connected to said high frequency contact the filter comprising a first inductive impedance electrically disposed in parallel with a second inductive impedance in series with a capacitive impedance, wherein said first and second inductive impedances comprise the first and second connecting elements.

8. An IC as recited in claim 7 wherein said capacitive impedance has a value that is chosen to resonate with said first and second inductive impedances.

9. An IC as recited in claim 7 wherein said first and second inductive impedances are substantially similar.

10. An IC as recited in claim 8 wherein said first and second inductive impedances are substantially similar.

11. An IC as recited in claim 7 wherein said capacitive impedance comprises a capacitor external to the IC.

12. An IC as recited in claim 7 wherein each said connecting element extends from said high frequency contact.

13. An IC as recited in claim 7 wherein said high frequency contact is a first high frequency contact and further comprising a second high frequency contact, wherein said first and second high frequency contacts carry substantially the same signal.

14. An IC as recited in claim 13 wherein said first and second high frequency contacts are adjacent each other.

* * * * *